United States Patent [19]

Phillips et al.

[11] Patent Number: 5,087,948
[45] Date of Patent: Feb. 11, 1992

[54] DISORDER-INDUCED NARROWBAND HIGH-SPEED ELECTRONIC DEVICES

[75] Inventors: Philip W. Phillips; Hong-L. Wu, both of Cambridge, Mass.; David H. Dunlap, Albuquerque, N. Mex.; Kalyan Kundu, Calcutta, India

[73] Assignee: Massachusetts Institute of Technology, Cambridge, Mass.

[21] Appl. No.: 542,596

[22] Filed: Jun. 25, 1990

[51] Int. Cl.⁵ .......................................... H01L 29/161
[52] U.S. Cl. ........................................ 357/16; 357/30; 357/4; 357/2; 357/59
[58] Field of Search ...................... 357/30 E, 16, 4, 2, 357/59

[56] References Cited

U.S. PATENT DOCUMENTS

| 4,806,993 | 2/1989 | Voisin et al. ............... 357/30 E |
| 4,985,737 | 1/1991 | Gaylord et al. ............ 357/30 E |
| 4,987,458 | 1/1991 | Gaylord et al. ............ 357/30 E |

OTHER PUBLICATIONS

Flores, "Transport in Models with Correlated Diagonal and Off-Diagonal Disorder", *J. Phys.: Condens. Matter I*, United Kingdom, pp. 8471–8479, Nov. 20, 1989.

Kumar, "Extended Electronic States in a Fibonacci Chain", *J. Phys.: Condens. Matter 2*, United Kingdom, pp. 1349–1353, Feb. 5, 1990.

Wu et al, "Repulsive Binary Alloys and the Absence of Localisation: Application to Fibonacci Lattices and Molecularly-based Electronic Filters", *J. Chem. Phys.*, vol. 93, pp. 7369–7382, Nov. 15, 1990.

Dunlap et al, "Superdiffusion in Structurally-Disordered Systems in any Spatial Dimension", *J. Chem. Phys.*, vol. 92, pp. 6093–7109, May 15, 1990.

Dunlap et al, "Absence of Localisation in a Random Dimer Model", *Physical Review Letters*, vol. 65, pp. 88–101, Jul. 2, 1990.

Dunlap et al, "Absence of Localization in Certain Statically Disordered Lattices in any Spatial Dimension", *Physical Review B*, vol. 40, No. 16, pp. 10999–11006, Dec. 1, 1989.

Ananthakrishna, "Bloch-Like States in a 1D Fibonacci Chain", *J. Phys.: Condens. Matter 2*, pp. 1343–1347, 1990.

*Primary Examiner*—William Mintel
*Attorney, Agent, or Firm*—Hamilton, Brook, Smith & Reynolds

[57] ABSTRACT

A disorder induced electronic filter is implemented using molecular systems such as semiconductor heterostructures and polymers. Two or more different materials are arranged to form a large number of layers with the arrangement being random and disordered so that no long range periodicity is created in the layers.

22 Claims, 2 Drawing Sheets

DISORDER-INDUCED NARROWBAND HIGH-SPEED ELECTRONIC DEVICES

This invention was made with government support under contract Number DMR-890303 awarded by the National Science Foundation. The government has certain rights in the invention.

TECHNICAL FIELD

This invention is in the field of solid-state physics.

BACKGROUND ART

Numerous applications in engineering and physics require the use of filters to selectively pass and reject various components of an incoming signal. For example, electromagnetic signals such as electrical and optical signals are filtered using filters implemented by electronic circuitry and optical lenses, respectively. Similarly, acoustic signals are filtered using mechanical means. Finally, charge-carrying particles, such as electrons, are filtered by electronic filters.

Filters in each of these regimes invariably suffer from one main problem: the passband of the filter—and, in particular, its center frequency and width—are difficult to control precisely. This is especially true in the case of filters that are intended to be extremely selective, i e., those having extremely narrow passbands. Also, the response time of such filters while extremely fast, is limited by the transit time of the filter medium. A need exists, therefore, for a high-speed filter which has a very narrow passband.

SUMMARY OF THE INVENTION

The present invention discloses a class of disorder-induced electronic filters characterized by their extreme frequency selectivity. These filters are implemented using molecular systems such as semiconductor heterostructures and polymers. In the former case, two (or more) different materials are arranged to form a large number of layers, with the arrangement being random once certain constraints have been met. That is the layers associated with the heterostructure are disordered, in that there is no long range periodicity associated with these layers. The case of polymers is similar, with two (or more) molecular groups occurring repeatedly in a long polymeric chain, again with the arrangement of these groups being constrained in a specific sense but otherwise random. In the general case of molecular systems, two (or more) different molecules occupy lattice sites in a one, two or three dimensional lattice, again random with certain constraints.

These arrangement constraints, which uniquely characterize the invention, are of two basic types. The first is embodied in the Random Dimer Model (RDM), in which at least one of the materials (in the semiconductor heterostructure case) is assigned to pairs of successive layers in the heterostructure. A generalization of the RDM exists and can be expressed mathematically. The second is the Random Binary Alloy (RBA), in which one of the materials cannot appear consecutively (i.e., a layer of this material must have layers of the other material on either side). A specific example of the RBA arrangement is the quasiperiodic Fibonacci arrangement of layers.

In order to be used as an electronic device, the semiconductor heterostructure is equipped with an electrical contact at at least one end. Electrons are supplied at one of these contacts either by the radiation of an electron beam from an external source of electrons or by physically coupling the metal contact to external circuitry. For the layer arrangements just described, under certain conditions, only those electrons in a narrow energy range (a narrow band of electronic states) transport superdiffusively through the heterostructure without being attenuated, i.e., without being scattered. Hence, the heterostructure functions as a bandpass filter. The center frequency and width of the filter are determined by details of the heterostructure and by the number of layers in the heterostructure, respectively. In particular, these two filter parameters are easily predetermined to achieve extremely precise selectivity. In addition, it should be noted that the heterostructures of the invention can be easily fabricated using current deposition techniques, such as molecular beam epitaxy (MBE), chemical vapor deposition (CVD), and organometallic CVD (OMCVD), or even by depositing molecules one-by-one with the use of scanning tunneling microscopes (STM) to make extremely small heterostructures.

Finally, the RDM and RBA molecular systems of the invention have application as high-speed solid-state switches (with the switching being controlled by a bias voltage) and in laser technology. In the switch application, electrical contacts are at both ends of the semiconductor heterostructure, and a bias voltage is applied across these contacts. When the bias voltage exceeds some threshold value, the heterostructure experiences a sudden dramatic drop in its resistivity, and electronic states in the heterostructure that lie in the heterostructure's passband transport through the device superdiffusively. The extremely short propagation time associated with these electronic states result in switching times on the order of picoseconds.

In addition, the semiconductor heterostructures of the invention may be used in laser applications. Specifically, the heterostructure may be used to optically pump a lasing medium in a narrow frequency band.

DETAILED DESCRIPTION OF THE INVENTION

Figure 1:
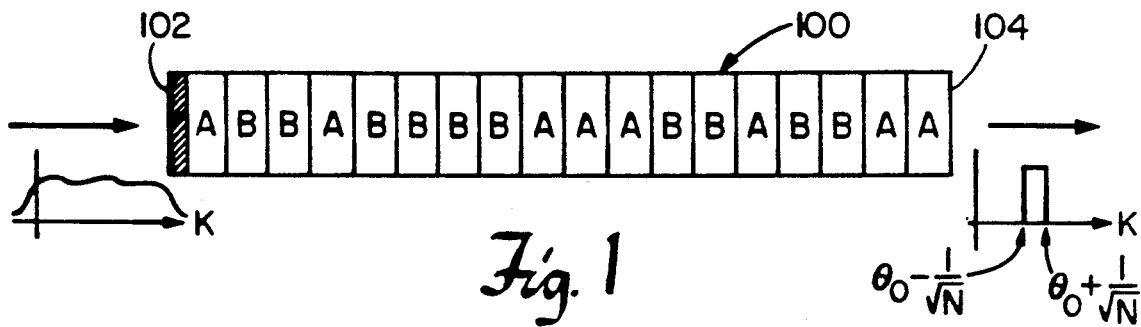
FIG. 1 illustrates the RDM arrangement of layers, configured to function as a narrowband electronic filter.

A semiconductor heterostructure embodiment of the invention is shown in FIG. 1. The heterostructure 100 comprises layers of two different materials. Materials A and B may comprise semiconductor compounds consisting of elements from different columns of the periodic table. For example, material A may be a III-IV compound, such as GaAs, and material B may be a different compound, such as InP or GaP. Alternatively, material A may be a III-IV compound, as above, and material B may be a II-VI compound, such as CdS or ZnO, or a IV-VI compound, such as PbS. In fact, material A or B may be a quaternary alloy, such as InAlAsP.

A metal contact 102 at one end of the heterostructure provides an electrical connection between the heterostructure and an external source of electrons. Specifically, electrons are applied at contact 102 either by the radiation of an electron beam from an external source of electrons or by physically coupling the metal contact to external circuitry. The arrangement of the layers of materials A and B result in a novel superdiffusive property. Specifically, certain electrons propagate through the heterostructure with a mean-square displacement that grows as $t^{3/2}$, thereby giving rise to infinite conductivity in contrast to electrons being transported by standard diffusion in which displacement grows as t and conductivity is finite.

There are two distinct layer arrangements that can yield superdiffusion. The first is called a Random Dimer Model (RDM), shown in FIG. 1. In the RDM, layers of at least one of the materials (i.e., either A or B or both) are present in pairs in the heterostructure. That is, for at least one of the materials, e.g., material B, an odd number of layers of material B may not lie between odd layers of material A.

Figure 2:
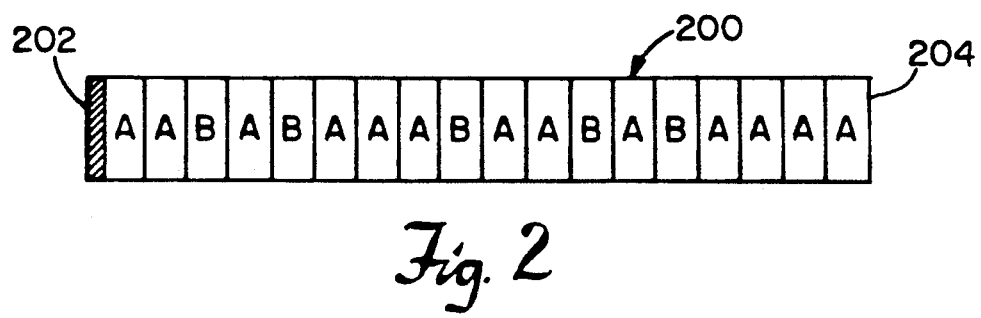
FIG. 2 illustrates the RBA arrangement of layers.

The second arrangement is that of the Random Binary Alloy (RBA), shown in FIG. 2. In the RBA, at least one of the materials A or B may not occur in adjacent layers but instead must always appear singly with the other material on either side.

Figure 3:
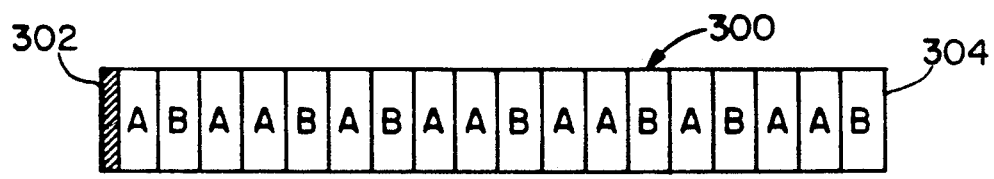
FIG. 3 illustrates the Fibonacci arrangement of layers.

One example of an RBA is the Fibonacci lattice arrangement, an arrangement of considerable experimental interest due to its quasiperiodicity. The Fibonacci arrangement, shown in FIG. 3, is constructed in the following recursive manner. Fibonacci arrangements having 1 and 2 layers are given by A and AB. To construct the 3 layer Fibonacci arrangement, the 1 layer arrangement is appended to the end of the 2 layer arrangement, yielding $(AB)(A)=ABA$. Similarly, the 5 layer arrangement is constructed by appending the 3 layer arrangement to the end of the 2 layer arrangement, and so on. As is evident, the B's will always occur singly, and so the Fibonacci arrangement is a special case of the RBA.

I. NARROWBAND ELECTRONIC FILTERS

Under certain conditions, each of the two basic layer arrangements, RDM and RBA, exhibits the superdiffusive property that can be exploited to construct narrowband electronic filters. That is, electrons are donated at the heterostructure's metal contact (i.e., contact 102 of FIG. 1, contact 202 of FIG. 2, or contact 302 of FIG. 3). If certain conditions are satisfied, then the electrons having energies in some range will transport superdiffusively through the heterostructure and emerge at the other end of the heterostructure. These conditions are stated below, with the more theoretical discussion being relegated to Section III.

I.A. RANDOM DIMER MODEL

Consider a layered heterostructure consisting of N layers formed from materials A and B according to the RDM. Let $\epsilon_A$ and $\epsilon_B$ denote the site energies (i.e., binding energies in the conduction band) for materials A and B, respectively wherein the site energies are determined by the well depths in the semiconductor heterostructure. Also denote by V the constant nearest neighbor matrix element connecting successive layers.

Then, if $$|\epsilon_A - \epsilon_B| < 2V, \tag{1}$$

a quantity proportional to $1/\sqrt{N}$ of the electronic states in the conduction band will transport superdiffusively through the heterostructure in a narrow energy range. It can be shown (see Section III.B.) that the band of unscattered states corresponds to electrons whose momenta are within $1/\sqrt{N}$ of $$k_o = \theta_o = \cos^{-1}\left( \frac{1 - 3q}{2\sqrt{(V/W)^2(1+q)^2 - 2q(1-q)}} \right) \tag{2}$$

where q is the fraction of layers of material B (i.e., the probability of choosing material B in the random arrangement) and $W = \epsilon_A - \epsilon_B$. Such electronic states can be thought of as being transparent to the disorder. All the other electronic states are localized, and hence are unable to contribute to transport.

From this discussion, it is apparent that if Equation 1 is satisfied by appropriately choosing the heterostructure well depths (i.e., site energies) and well spacings (i.e., separations), then the device consisting of the heterostructure equipped with metal end contacts can be used as an electronic filter. The center frequency (See Equation 2) of the passband of this filter is determined by the matrix element V, the site energies $\epsilon_A$ and $\epsilon_B$, and the relative frequencies of the dimer defects. The width of the passband is determined by the number of layers in the heterostructure. Hence, the longer the heterostructure, the more selective the filter.

The filter operates as follows. Referring to FIG. 1, electrons are donated at metal contact 102. As shown in the plot of electron density versus wavevector K, the inputted electronic signal at contact 102 is broadband. Only those electrons with momenta within the range $\theta - 1/\sqrt{N}$ to $\theta + 1/\sqrt{N}$ transport superdiffusively through the heterostructure 100 and emerge at the output end 104 of the heterostructure. The electronic states lying outside this range remain localized inside the heterostructure. Hence, the outputted electronic signal is narrowband, and the heterostructure operates as a bandpass filter.

I.B. RANDOM BINARY ALLOY

Now consider a semiconductor heterostructure with materials A and B being arranged according to the RBA, with $\epsilon_A$ and $\epsilon_B$ denoting the same quantities as before. Here, however, two nearest neighbor matrix elements are needed, and accordingly let $V_A$ denote the matrix element corresponding to two successive type-A defects (i.e., layers) and let $V_C$ denote the element for adjacent type-A and type-B defects. Note that two type-B defects may not occur successively, as must be true in the case of the RBA arrangement.

As in the RDM case, superdiffusion is exhibited by a quantity of the electronic states proportional to $1/\sqrt{N}$, if a certain inequality is satisfied. The inequality here is slightly different:

$$V_A|\epsilon_A - \epsilon_B| < 2|V_A^2 - V_C^2|. \tag{3}$$

As before, all the other electronic states are localized and are hence are unable to contribute to transport. It can be shown (see section III.C.) that the band of unscattered states corresponds to electrons whose momenta are within $1/\sqrt{N}$ of $$k_o = \theta_o = \cos^{-1}\left(\frac{WV_A}{2(V_A^2 - V_C^2)}\right) \quad (4)$$

Hence, if the condition of Equation 3 is satisfied by appropriately choosing the heterostructure well depths and well spacings, then the device consisting of the heterostructure equipped with a metal end contact can function as an electronic filter. The center frequency is given by Equation 4 and the width of the passband is given by $1/\sqrt{N}$.

II. HIGH-SPEED SWITCH AND OPTICAL PUMPING APPLICATIONS

Thus far, the use of RDM and RBA heterostructures in the context of bandpass filtering of electronic states has been described. In fact, these heterostructures exhibit behavior that allows them to function as high-speed switches.

Figure 4:
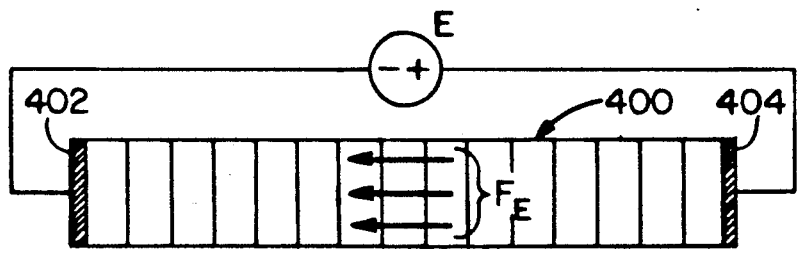
FIG. 4 illustrates a semiconductor heterostructure being used as a high-speed electronic switch.

Consider the system of FIG. 4, which illustrates a semiconductor heterostructure 400 having input metal contact 402 and output metal contact 404. A nominal bias voltage E is applied across the contacts 402 and 404 such that an electric field $F_E$ is produced in the heterostructure, with field lines pointing from right to left for a positive value of E. Electrons present in the heterostructure drift in response to the electric field.

Figure 5:
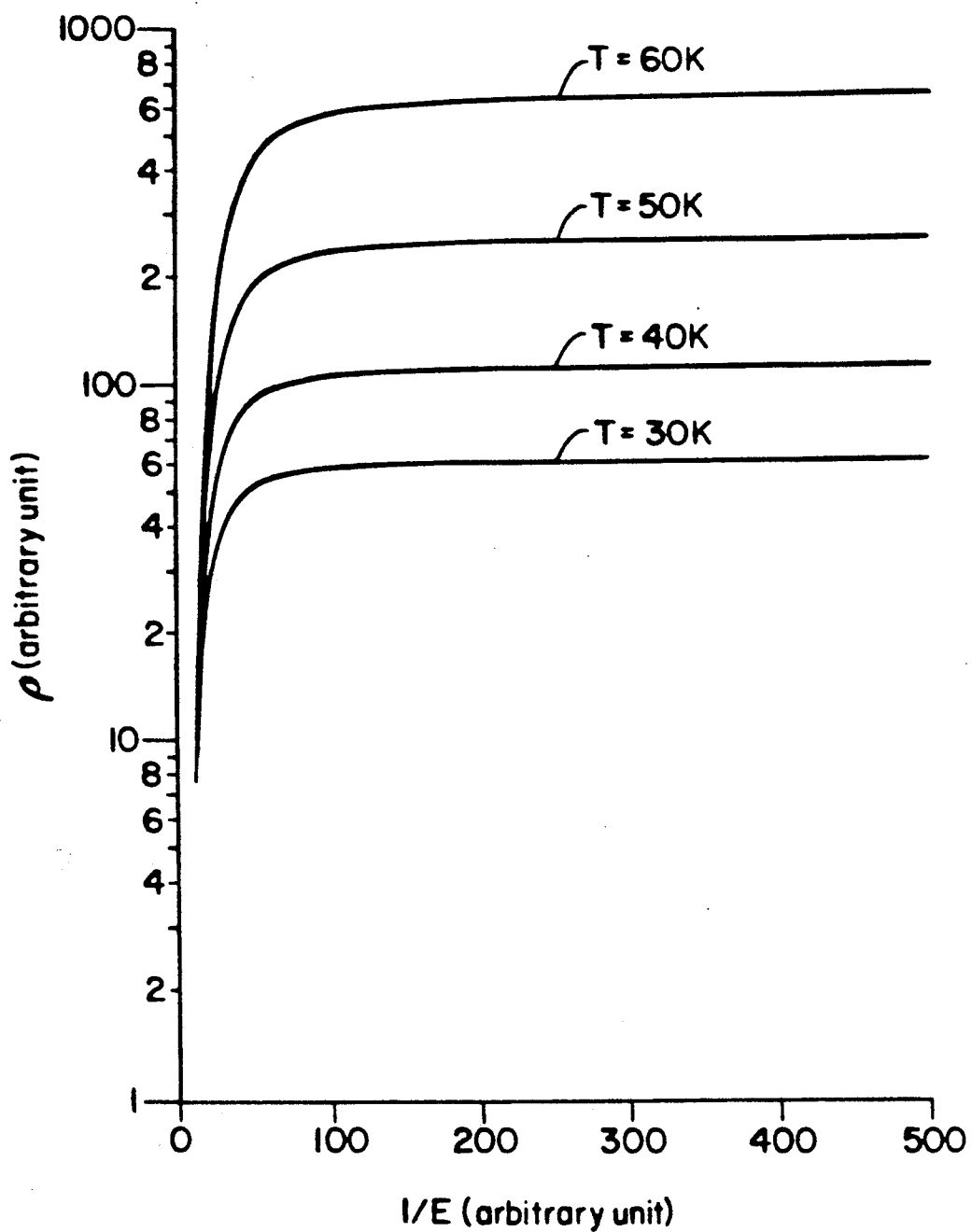
FIG. 5 is a plot of resistivity $\rho$ versus $1/E$ for an RDM semiconductor heterostructure.

However, as is indicated by the FIG. 5 plot of resistivity $\rho$ versus 1/E. as the magnitude of the applied voltage increases from its nominal value, the resistivity abruptly decreases near some threshold value. Hence for sufficiently high values of E, electrons in the heterostructure that lie in the energy band corresponding to the range of momenta $\theta_0 - 1/\sqrt{N}$ to $\theta_0 + 1/\sqrt{N}$ transport superdiffusively through the heterostructure. The threshold behavior which causes the abrupt transition to superdiffusive transport for a band of electronic states permits the system to function as an electronic switch. Moreover, since the transit time for an electron within the superdiffusion passband to pass through the heterostructure is on the order of picoseconds, so too is the switching time, thereby yielding an extremely fast switching device.

Figure 6:
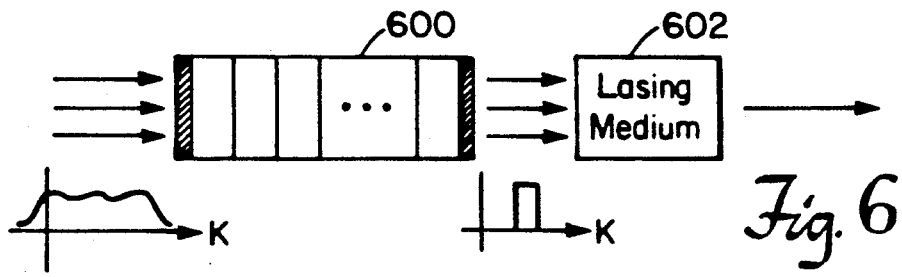
FIG. 6 illustrates a semiconductor heterostructure being used to optically pump a laser.

The RDM and RBA heterostructures can also be used in laser applications. Referring to FIG. 6, the heterostructure 600 is used to optically pump a lasing medium 602 with extremely narrowband radiation.

III. THEORY AND DERIVATIONS

In section I above, two types of disorder, namely RDM and RBA, that cause certain electronic states to undergo superdiffusion were described. It is this selective character of the heterostructure which permits the device to function as an electronic filter. In fact, RDM is one model in a general class of models that can be described mathematically. In this section, this general class of disorder models is introduced. Moreover, theoretical details that were omitted in Section I are included.

III. A. GENERALIZATIONS OF RANDOM DIMER MODEL

Assume that $\underline{n}$ is the direct lattice vector for a particular site an operator $a_{\underline{n}}^+$ creates an electron at this site, and $\underline{\mu}$ is a positive unit vector originating at $\underline{n}$ and pointing to the nearest neighbor sites along the $\underline{\mu}^{th}$ direction of the crystal. Also, assume that $V_\mu$ is the bare bandwidth along the $\underline{\mu}^{th}$ direction, and $G_{\mu;\underline{n},\underline{n}+\underline{\mu}}$ is a random bond variable connecting sites $\underline{n}$ and $\underline{n}+\underline{\mu}$. In the context of structurally induced disorder, $G_{\mu;\underline{n},\underline{n}+\underline{\mu}}$ can be shown to be a function of the relative displacement between ions located at lattice sites $\underline{n}$ nd $\underline{n}+\underline{\mu}$. Then, any system described by a Hamiltonian of the form $$H = \sum_{\underline{n}} \epsilon_{\underline{n}} a_{\underline{n}}^+ a_{\underline{n}} + \sum_{\underline{n},\mu} V_{\mu;\underline{n},\underline{n}+\underline{\mu}} (a_{\underline{n}}^+ a_{\underline{n}+\underline{\mu}} + a_{\underline{n}+\underline{\mu}}^+ a_{\underline{n}}) \quad (5)$$

will exhibit transmission resonances which give rise to superdiffusive transport if the site energies $\epsilon_n$ and transfer matrix elements $V_{\mu;\underline{n},\underline{n}+\underline{\mu}}$ can be written as $$\epsilon_n = \sum_\mu (G_{\mu;\underline{n},\underline{n}+\underline{\mu}} + G_{\mu;\underline{n},\underline{n}-\underline{\mu}}) \quad (6)$$

and $$V_{\mu;\underline{n},\underline{n}\pm\underline{\mu}} = \sqrt{V_\mu^2 + G_{\mu;\underline{n},\underline{n}\pm\underline{\mu}}^2 - 2G_{\mu;\underline{n},\underline{n}\pm\underline{\mu}} V_\mu \cos\theta_\mu} \quad (7)$$

RDM arrangement is an example of such systems in that its well depths and barrier spacings are formed so as to satisfy Equations 6 and 7.

III.B. DERIVATION OF RDM FILTER PARAMETERS

To determine the center frequency (given by Equation 2) and width of the passband of the RDM filter, consider an otherwise ordered lattice with a single dimer defect (i.e , all but two adjacent layers are of material A). Place the dimer on sites 0 and 1 and assign the energy $\epsilon_A$ to all sites except these two sites which are assigned energy $\epsilon_B$. A constant nearest neighbor matrix element V mediates transport between the sites. First it will be shown that $1/\sqrt{N}$ of the electronic states are unscattered by the dimer impurity. Then, the center frequency of the passband for an arrangement containing randomly placed dimers (as opposed to a single dimer defect) is derived.

To proceed, the reflection and transmission coefficients through the dimer impurity are calculated as follows: Consider the eigenvalue equation $$EC_n = \epsilon_n C_n + V(C_{n+1} + C_{n-1}) \quad (8)$$

for the site amplitudes, where $C_n$ is the amplitude that the electron is at site n. Expressing the site amplitudes as $C_n = e^{ikn} + \beta e^{-ikn}$ for $n \leq -1$ and $C_n = \gamma e^{ikn}$ for $n \geq 1$ where $\beta$ and $\gamma$ are the reflection and transmission amplitudes, respectively, it follows from Equation 8 for sites $-1$ and 1 that $C_0 = 1 + \beta = \gamma(We^{-ik}+V)/V$ with $W = \epsilon_A - \epsilon_B$. Substitution of this result into Equation 8 for site 0 results in the closed-form expression:

$$|\beta|^2 = \frac{W^2(W + 2V\cos k)^2}{W^2(W + 2V\cos k)^2 + 4V^4 \sin^2 k} \quad (9)$$

for the reflection probability. Note that the reflection coefficient vanishes when $\epsilon_A - \epsilon_B = 2V\cos k$ or equivalently when $-2V < \epsilon_A - \epsilon_B < 2V$. The location in the parent ordered band of the perfectly transmitted electronic state corresponds to the wavevector $k_o = -\cos^{-1}[(\epsilon_B - \epsilon_A)/2V]$. To determine the total number of states that behave in this fashion, $\beta$ is expanded around $k_o$. To lowest order, in the vicinity of $k_o$, $|\beta|^2 \sim (\Delta k)^2$ where $\Delta k = k - k_o$.

Consider now a crystal containing a certain fraction of randomly-placed dimer impurities (i.e., not just a single dimer defect). Electronic states in the vicinity of $k_o$ will be reflected with a probability proportional to $(\Delta k)^2$. The time between scattering events $\tau$ is inversely proportional to the reflection probability. As a result, in the random system, the mean free path $\lambda = \langle \text{velocity} \rangle \tau \sim 1/(\Delta k)^2$ in the vicinity of $k_o$. Let $\Delta k = (\frac{1}{2}\pi)(\Delta N/N)$. Upon equating the mean free path to the length of the system (N) the total number ($\Delta N$) of states whose mean free path is equal to the system size is found to scale as $\Delta N = \sqrt{N}$. Because the mean free path $\sim$ localization length is in 1-dimension, the total number of states whose localization lengths diverge is $\sqrt{N}$. Consequently, in the random dimer model, $\sqrt{N}$ of the electronic states remain extended over the total length of the system. Such states move through the crystal ballistically with a constant group velocity $v(k)$ except when they are located at the bottom or the top of the band where the velocity vanishes. Because all the other electronic states are localized, the diffusion constant is determined simply by integrating $v(k)\lambda(k)$ over the width of k-states that participate in the transport. The upper limit of the integration is then proportional to the total fraction of unscattered states or $1/\sqrt{N}$ and $\lambda(k) \sim N$. In the case when the velocity is a nonzero constant, $D \sim \sqrt{N}$. Because the states which contribute to transport traverse the length of the system with a constant velocity, t and N can be interchanged so that $D \sim t^{\frac{1}{2}}$. Consequently the mean-square displacement grows as $t^{3/2}$. At the bottom or the top of the band where the group velocity vanishes, $v(k) \sim k$ and $D \sim O(1)$.

Finally, the exact location of the set of perfectly transmitted electronic states in the energy band of the disordered system (in other words, the passband center frequency) must be determined. To do so consider the correlated disorder model of Equations 5-7. Having shown above that the fraction of states in the vicinity of $k = \theta_0$ that remains unscattered scales as $1/\sqrt{N}$, the value of $\theta_0$ must be determined. To apply the model of Equations 5-7 to the problem at hand, note that the site energies in the Random Dimer Model can be constructed from a constrained bi-valued distribution of G's, i.e., from a distribution of the form $G_{n,n\pm1} = G_a$ and $G_{n,n\pm1} = G_B$ with probabilities P and $1-P$, respectively. Because the site energies are of the form $\epsilon_n = G_{n,n+1} + G_{n,n-1}$, $G_B$ cannot occur consecutively in the lattice. The resultant site energies will be $\epsilon_A = 2G_A$ and $\epsilon_B = G_B + G_A$ with the $\epsilon_B$'s occuring in pairs. The matrix elements that are generated by $G_A$ and $G_B$ must be equal in the RDM. Solving the two simultaneous equations that result from Equation 7 for the value of $\cos\theta_o$ that makes the matrix elements equal yields the general condition for the location of the unscattered state:

$$\cos\theta_o = \frac{1 - 3q}{2\sqrt{(V/W)^2(1+q)^2 - 2q(1-q)}} \quad (10)$$

where q is the concentration of $\epsilon_A$. Note that the location of the unscattered state is then a function of the concentration, as well as the relative disorder V/W with $W = \epsilon_a - \epsilon_b$. Substitution of Equation 10 into the restriction $-1 \leq \cos\theta_0 \leq 1$ yields the general result that $-1 \leq W/2V \leq 1$ for an unscattered state to exist. Note that when $\epsilon_A - \epsilon_B = \pm 2V$, $\cos\theta_o = \pm 1$, regardless of the concentration q. In this case, the unscattered states have zero velocity and diffusion is obtained. For all other values of W, provided that $-1 \leq W/2V \leq 1$, the location of the unscattered states depends on q and will have a non-zero velocity.

III.C. DERIVATION OF RBA FILTER PARAMETERS

To determine the center frequency (given by Equation 4) and width of the passband of the RBA filter, the reflection and transmission coefficients on an otherwise ordered infinite 1-dimensional lattice with a single type-B defect are computed. Place the defect with energy $\epsilon_B$ on site 0. All sites other than site 0 are assigned the energy $\epsilon_A$. The matrix element $V_A$ connects all nearest-neighbor site pairs except site pairs $(-1,0)$ and $(0,1)$, which are connected by $V_C$. It is now shown that $\sqrt{N}$ of the electronic states have unit transmission coefficients through the single defect.

The eigenvalue equation for the site amplitudes is:

$$EC_n = \epsilon_n C_n + V_{n,n+1}C_{n+1} + V_{n,n-1}C_{n-1}. \quad (11)$$

with site amplitudes $C_n$ expressed as $C_n = e^{ikn} + Re^{-ikn}$ for $n \leq -1$ and $C_n = Te^{ikn}$ for $n \geq 1$, where R and T are the reflection and transmission amplitudes, respectively. From the eigenvalue equation for sites $-1$ and $1$, it follows that $C_0 = V_A/V_B(1+R) = TV_A/V_B$. Substitution of this result into the eigenvalue equation for site 0 results in the closed-form expression:

$$|R|^2 = \frac{V_A W - 2(V_A^2 - 2V_C^2)\cos k)^2}{(V_A W - 2(V_A^2 - 2V_C^2)\cos k)(V_A W + 2V_A^2\cos k) + 4V_C^2}$$

for the reflection probability, where $W = \epsilon_A = \epsilon_B$. The reflection probability $|R|^2$ vanishes when:

$$V_A|\epsilon_A - \epsilon_B| \leq 2|V_A^2 - V_C^2|,$$

and solving for the corresponding value of $k_o$ yields $$k_o = \cos^{-1}(WV_A/2(V_A^2 - V_C^2))$$

as the wavevector of the perfectly transmitted wave.

To determine the width of the states in the vicinity of $k_o$ that remain unscattered. R is expanded about $k_o$. To lowest order in $\Delta k = k - k_o$, $|R|^2 \sim (\Delta k)^2$. Because the scattering time $\tau$ is inversely proportional to the reflection coefficient, the mean free path in the RBA heterostructure in the vicinity of $k_o$ scales as $\lambda = \langle \text{velocity} \rangle \tau \sim 1(\Delta k)^2$. Equating $\lambda$ with the system size N yields the total fraction of states having mean free paths or equivalently, localization lengths (for $d = 1$) equal to or longer than the system size as being given by $\Delta k \sim 1/\sqrt{N}$.

We claim:

1. A device for transporting charge-carrying particles applied to a disordered molecular system wherein a plurality of different molecules appear in a lattice arrangement and are arranged in the lattice in such a manner that only charge-carrying particles in some energy range transport superdiffusively through the molecular system.

2. A device as claimed in claim 1 wherein the molecular system comprises a semiconductor heterostructure of a plurality of different materials, and at least one end of said heterostructure is equipped with an electrical contact.

3. A device as claimed in claim 2 wherein said heterostructure comprises two materials.

4. A device as claimed in claim 3 wherein layers of the semiconductor heterostructure are ordered in such a manner that the heterostructure is described by a Hamiltonian of the form $$H = \sum_n \epsilon_n a_{\underline{n}}^+ a_{\underline{n}} + \sum_{n,\mu} V_{\mu;\underline{n},\underline{n}+\underline{\mu}} (a_{\underline{n}}^+ a_{\underline{n}+\underline{\mu}} + a_{\underline{n}+\underline{\mu}}^+ a_{\underline{n}})$$

with the site energies $\epsilon_n$ given by $$\epsilon_n = \sum_\mu (G_{\mu;\underline{n},\underline{n}+\underline{\mu}} + G_{\mu;\underline{n},\underline{n}-\underline{\mu}})$$

and the transfer matrix elements $V_{\mu;n,n+\mu}$ given by $$V_{\mu;\underline{n},\underline{n}+\underline{\mu}} = \sqrt{V_\mu^2 + G_{\mu;\underline{n},\underline{n}\pm\underline{\mu}}^2 - 2G_{\mu;\underline{n},\underline{n}\pm\underline{\mu}} V_\mu \cos\theta_\mu}$$

wherein n is the direct lattice vector for a particular site, an operator $a_{\underline{n}}^+$ creates an electron at this site, $\underline{\mu}$ is a positive unit vector originating at n and pointing to the nearest neighbor sites along the $\underline{\mu}^{th}$ direction of the crystal, $V_\mu$ is the bare bandwidth along the $\underline{\mu}^{th}$ direction, and $G_{\mu;\underline{n},\underline{n}+\underline{\mu}}$ is a random bond variable connecting sites $\underline{n}$ and $\underline{n}+\underline{\mu}$.

5. A device as claimed in claim 2 wherein layers of the semiconductor heterostructure are ordered in such a manner that at least one of said materials never appears in an odd number of consecutive layers.

6. A device as claimed in claim 2 wherein layers of the semiconductor heterostructure are ordered in such a manner that at least one of said materials never appears in consecutive layers.

7. A device as claimed in claim 3 wherein layers of the semiconductor heterostructure are ordered in a Fibonacci arrangement, wherein the Fibonacci arrangement of layers is constructed by appending a one layer arrangement consisting of said first material to an end of a two layer arrangement consisting of said first material followed by said second material to yield a three layer arrangement, and then appending said two layer arrangement to an end of said three layer arrangement to yield a five layer arrangement and then appending said three layer arrangement to an end of said five layer arrangement to yield an eight layer arrangement, and so on, until the number of layers in the construction is greater than or equal to a predetermined number of layers in the heterostructure, and then truncating the construction to said predetermined number of layers.

8. A device as claimed in claim 1 further comprising a means for biasing the potential difference across electrical contacts coupled to at least two ends of the molecular system, with said biasing means controlling the resistivity of the heterostructure.

9. A device as claimed in claim 8 wherein the heterostructure resistivity exhibits a substantially threshold dependence on said applied potential difference.

10. A device for transporting charge-carrying particles applied to a disordered semiconductor heterostructure wherein first and second materials appear in layers and said layers of the heterostructure are ordered in such a manner that the heterostructure is described by a Hamiltonian of the form $$H = \sum_n \epsilon_n a_{\underline{n}}^+ a_{\underline{n}} + \sum_{n,\mu} V_{\mu;\underline{n},\underline{n}+\underline{\mu}} (a_{\underline{n}}^+ a_{\underline{n}+\underline{\mu}} + a_{\underline{n}+\underline{\mu}}^+ a_{\underline{n}})$$

with the site energies $\epsilon_n$ given by $$\epsilon_n = \sum_\mu (G_{\mu;\underline{n},\underline{n}+\underline{\mu}} + G_{\mu;\underline{n},\underline{n}-\underline{\mu}})$$

and the transfer matrix elements $V_{\mu;n,n+\mu}$ given by $$V_{\mu;\underline{n},\underline{n}+\underline{\mu}} = \sqrt{V_\mu^2 + G_{\mu;\underline{n},\underline{n}\pm\underline{\mu}}^2 - 2G_{\mu;\underline{n},\underline{n}\pm\underline{\mu}} V_\mu \cos\theta_\mu}$$

wherein $\underline{n}$ is the direct lattice vector for a particular site, an operator $a_n^+$ creates an electron at this site, $\mu$ is a positive unit vector originating at $\underline{n}$ and pointing to the nearest neighbor sites along the $\underline{\mu}^{th}$ direction of the crystal, $V_\mu$ is the bare bandwidth along the $\underline{\mu}^{th}$ direction, and $G_{\mu;\underline{n},\underline{n}+\underline{\mu}}$ is a random bond variable connecting sites $\underline{n}$ and $\underline{n}+\underline{\mu}$ so that only charge-carrying particles in some energy range transport superdiffusively through the heterostructure.

11. A device for transporting charge-carrying particles applied to a disordered semiconductor heterostructure wherein first and second materials appear in layers and said layers of the heterostructure are ordered in such a manner that at least one of said materials never appears in an odd number of consecutive layers, so that only charge-carrying particles in some energy range transport superdiffusively through the heterostructure.

12. A device for transporting charge-carrying particles applied to a disordered semiconductor heterostructure wherein first and second materials appear in layers and said layers of the heterostructure are ordered in such a manner that at least one of said materials never appears in consecutive layers, so that only charge-carrying particles in some energy range transport superdiffusively through the heterostructure.

13. A device for transporting charge-carrying particles applied to a disordered semiconductor heterostructure wherein first and second materials appear in layers and said layers of the heterostructure are ordered in a Fibonacci arrangement, wherein the Fibonacci arrangement of layers is constructed by appending a one layer arrangement consisting of said first material to an end of a two layer arrangement consisting of said first material followed by said second material to yield a three layer arrangement, and then appending said two layer arrangement to an end of said three layer arrangement to yield a five layer arrangement, and then appending said three layer arrangement to an end of said five layer arrangement to yield an eight layer arrangement, and so on, until the number of layers in the construction is greater than or equal to a predetermined number of layers so that only charge-carrying particles in some energy range transport superdiffusively through the heterostructure.

14. A method of filtering an electrical signal comprising the steps of:
applying charge carrying particles to an input of a disordered molecular system including a plurality of different molecules in a lattice arrangement order and an output; and transporting only charge carrying particles in a predetermined energy range superdiffusively through the disordered molecular system and said output without being attenuated so that the disordered molecular system functions as a bandpass filter.

15. A method as recited in claim 14, wherein said molecular system further comprises a semiconductor heterostructure of a plurality of different materials, and at least one end of said heterostructure is equipped with an electrical contact.

16. A method as recited in claim 15, wherein layers of the semiconductor heterostructure are ordered in such a manner that at least one of said materials never appears in an odd number of consecutive layers.

17. A method as recited in claim 15, wherein layers of the semiconductor heterostructure are ordered in such a manner that at least one of said materials never appears in consecutive layers.

18. A method, as recited in claim 15, wherein said heterostructure comprises two materials.

19. A method, as recited in claim 18, wherein layers of the semiconductor heterostructure are ordered in such a manner that the heterostructure is described by a Hamiltonian of the form $$H = \sum_n \epsilon_n a_{\underline{n}}^+ a_{\underline{n}} + \sum_{n,\mu} V_{\mu;\underline{n},\underline{n}+\underline{\mu}}(a_{\underline{n}}^+ a_{\underline{n}+\underline{\mu}} + a_{\underline{n}+\underline{\mu}}^+ a_{\underline{n}})$$

with the site energies $\epsilon_n$ given by $$\epsilon_n = \sum_\mu (G_{\mu;\underline{n},\underline{n}+\underline{\mu}} + G_{\mu;\underline{n},\underline{n}-\underline{\mu}})$$

and the transfer matrix elements $V_{\mu;n,n+\mu}$ given by $$V_{\mu;\underline{n},\underline{n}+\underline{\mu}} = \sqrt{V_\mu^2 + G_{\mu;\underline{n},\underline{n}\pm\underline{\mu}}^2 - 2G_{\mu;\underline{n},n\pm\underline{\mu}}V_\mu \cos\theta_\mu}$$

wherein $\underline{n}$ is the direct lattice vector for a particular site, an operator $a_{\underline{n}}^+$ creates an electron at this site, $\mu$ is a positive unit vector originating at $\underline{n}$ and pointing to the nearest neighbor sites along the $\overline{\mu}^{th}$ direction of the crystal, $V_\mu$ is the bare bandwidth along the $\mu^{th}$ direction, and $G_{\mu;\underline{n},n+\underline{\mu}}$ is a random bond variable connecting sites $\underline{n}$ and $\underline{n+\mu}$.

20. A method as claimed in claim 19, wherein layers of the semiconductor heterostructure are ordered in a Fibonacci arrangement, wherein the Fibonacci arrangement of layers is constructed by appending a one layer arrangement consisting of said first material to an end of a two layer arrangement consisting of said first material followed by said second material to yield a three layer arrangement, and then appending said two layer arrangement to an end of said three layer arrangement to yield a five layer arrangement, and then appending said three layer arrangement to an end of said five layer arrangement to yield an eight layer arrangement, and so on, until the number of layers in the construction is greater than or equal to a predetermined number of layers in the heterostructure, and then truncating the construction to said predetermined number of layers.

21. A method of switching comprising:
applying charge carrying particles to an input of a disordered molecular system including a plurality of different molecules in a lattice arrangement and an output;
transporting only charge carrying particles in a predetermined energy range superdiffusively through the disordered molecular system and said output without being attenuated so that the disordered molecular system functions as a bandpass filter; and
applying a bias signal across electrical contacts coupled to at least two ends of the molecular system, with said bias signal controlling the resistivity of the heterostructure.

22. A device for transporting charge-carrying particles applied to a disordered molecular system wherein a plurality of different molecules appear in a lattice arrangement and are arranged in such a manner that only charge-carrying particles in some energy range transport superdiffusively through the molecular system wherein only those electrons with moments within the range $\theta - 1/\sqrt{N}$ to $\theta + 1/\sqrt{N}$ transport superdiffusively through the heterostructure, where N is the number of layers in the heterostructure and $\theta$ represents a center frequency of a system passband.

* * * * *

UNITED STATES PATENT AND TRADEMARK OFFICE
CERTIFICATE OF CORRECTION

PATENT NO. : 5,087,948

DATED : February 11, 1992

INVENTOR(S) : Philip W. Phillips, Hong-L. Wu, David H. Dunlap & Kalyan Kundu

It is certified that error appears in the above-identified patent and that said Letters Patent is hereby corrected as shown below:

In col. 5, at line 65, replace " $a_n^+$ " with --- $a_n^+$ ---.

In col. 5, at line 66, replace " $\mu$ " with --- $\mu$ ---.

In col. 6, at line 2, replace " $n+\mu$ " with --- $n+\mu$ ---.

In Equation 5, at col. 6, line 9, replace " $\epsilon_n a_n^+ a_n$ " with --- $\epsilon_n a_n^+ a_n$ ---; replace " $a_n^+ a_{n+\mu}$ " with --- $a_n^+ a_{n+\mu}$ ---.

In Equation 6, at col. 6, line 17, replace " $G_{\mu;n,n-\mu}$ "

UNITED STATES PATENT AND TRADEMARK OFFICE
CERTIFICATE OF CORRECTION

PATENT NO. : 5,087,948

DATED : February 11, 1992

INVENTOR(S) : Philip W. Phillips, Hong-L. Wu, David H. Dunlap & Kalyan Kundu

It is certified that error appears in the above-identified patent and that said Letters Patent is hereby corrected as shown below:

with --- $G_{\mu;n,n-\mu}$ ---.

In Equation 7, at col. 6, line 22, replace " $V_\mu{}^2$ " with --- $V_\mu^2$ ---.

In Claim 4, at col. 9, line 11, replace " $\epsilon_n a_n{}^+ a_n$ " with --- $\epsilon_n a_n^+ a_n$ ---; replace " $V_{\mu;n,n+\mu}$ " with --- $V_{\mu;n,n+\mu}$ ---; replace " $a_n{}^+ a_{n+\mu}$ " with --- $a_n^+ a_{n+\mu}$ ---. At col. 9, line 19, replace " $V_{\mu;n,n+\mu}$ " with --- $V_{\mu;n,n+\mu}$ ---. At col. 9, line 23, replace " $V_\mu{}^2$ "

UNITED STATES PATENT AND TRADEMARK OFFICE
CERTIFICATE OF CORRECTION

PATENT NO. : 5,087,948                      Page 3 of 5

DATED : February 11, 1992

INVENTOR(S) : Philip W. Phillips, Hong-L. Wu, David H. Dunlap & Kalyan Kundu

It is certified that error appears in the above-identified patent and that said Letters Patent is hereby corrected as shown below:

with --- $V_\mu^2$ ---; replace " $G_{\mu;n,n\pm\mu}$ " with --- $G_{\mu;\underline{n},\underline{n}\pm\underline{\mu}}$ ---. At col. 9, line 25, replace " n " with --- $\underline{n}$ ---. At col. 9, line 26, replace " $a_n^+$ " with --- $a_{\underline{n}}^+$ ---. At col. 9, line 27, replace " n " with --- $\underline{n}$ ---.

In Claim 10, at col. 10, line 5, replace " $\epsilon_n a_n^+ a_n$ " with --- $\epsilon_n a_{\underline{n}}^+ a_{\underline{n}}$ ---; replace " $a_n^+ a_{n+\mu}$ " with --- $a_{\underline{n}}^+ a_{\underline{n}+\underline{\mu}}$ ---. At col. 10, line 13, replace " $V_{\mu;n,n+\mu}$ " with --- $V_{\mu;\underline{n},\underline{n}+\underline{\mu}}$ ---. At col. 10, line 20, replace

UNITED STATES PATENT AND TRADEMARK OFFICE
CERTIFICATE OF CORRECTION

PATENT NO. : 5,087,948
DATED : February 11, 1992
INVENTOR(S) : Philip W. Phillips, Hong-L. Wu, David H. Dunlap & Kalyan Kundu It is certified that error appears in the above-identified patent and that said Letters Patent is hereby corrected as shown below:

" $a_n^+$ " with --- $a_n^+$ ---; replace " $\mu$ " with --- $\underline{\mu}$ ---.

In Claim 19, at col. 11, line 27, replace " $\epsilon_n a_n^+ a_n$ " with --- $\epsilon_n a_\underline{n}^+ a_\underline{n}$ ---; replace " $a_n^+ a_{n+\mu}$ " with --- $a_\underline{n}^+ a_{\underline{n}+\underline{\mu}}$ ---. At col. 11, line 34, replace " $V\mu;n,n+\mu$ " with --- $V_{\underline{\mu};\underline{n},\underline{n}+\underline{\mu}}$ ---. At col. 11, line 38, replace " $V_\mu^2$ " with --- $V_{\underline{\mu}}^2$ ---. At col. 11, line 42, replace " $a_n^+$ " with --- $a_\underline{n}^+$ ---; replace " $\mu$ " with --- $\underline{\mu}$ ---. At col. 11, line 44, replace " $\mu^{th}$ " with --- $\underline{\mu}^{th}$ ---. At col. 11, line 45, replace " $\mu^{th}$ " with

UNITED STATES PATENT AND TRADEMARK OFFICE
CERTIFICATE OF CORRECTION

PATENT NO. : 5,087,948

DATED : February 11, 1992

INVENTOR(S) : Philip W. Phillips, Hong-L. Wu, David H. Dunlap & Kalyan Kundu

It is certified that error appears in the above-identified patent and that said Letters Patent is hereby corrected as shown below:

--- $\mu^{th}$ ---.

In Claim 22, at col. 12, line 39, replace " moments " with --- momenta ---.

Signed and Sealed this

Fourth Day of October, 1994

Attest:

BRUCE LEHMAN

Attesting Officer

Commissioner of Patents and Trademarks